United States Patent [19]

Pryor et al.

[11] Patent Number: 4,725,374
[45] Date of Patent: Feb. 16, 1988

[54] PROCESS AND APPARATUS FOR ETCHING COPPER BASE MATERIALS

[75] Inventors: Michael J. Pryor, Woodbridge; Andrew J. Brock, Cheshire, both of Conn.

[73] Assignee: Olin Corporation, New Haven, Conn.

[21] Appl. No.: 2,584

[22] Filed: Jan. 12, 1987

Related U.S. Application Data

[60] Division of Ser. No. 715,317, Mar. 25, 1985, and a continuation-in-part of Ser. No. 539,598, Oct. 6, 1983.

[51] Int. Cl.[4] .......................... C09K 13/04; C23F 1/00
[52] U.S. Cl. .................................. 252/79.2; 252/79.3; 156/666
[58] Field of Search ............................. 252/79.3, 79.2; 156/666

[56] References Cited

U.S. PATENT DOCUMENTS 2,982,625  5/1961  Saubestre .
3,470,044  9/1969  Radimer .
3,917,521  11/1975  Clarke et al. .
3,936,332  2/1976  Matsumoto et al. .
3,939,089  2/1976  Matsumoto et al. .
4,085,016  4/1978  Janjua et al. .
4,110,237  8/1978  Matsumoto et al. .
4,144,144  3/1979  Radimer et al. .
4,482,440  11/1984  Kadija .

OTHER PUBLICATIONS

CRC Handbook of Chemistry and Physics, 61st edition, 1980–1981, CRC Press, p. B-154.

*Primary Examiner*—Kenneth M. Schor
*Assistant Examiner*—Lori-Ann Cody
*Attorney, Agent, or Firm*—Paul Weinstein

[57] ABSTRACT

A solution for etching copper or a copper base material, the solution consisting essentially of peroxydisulfuric acid, being present in an amount of from about 0.5N up to about 6.0N, with chloride or fluoride present in an amount of from about 10 ppm up to about 500 ppm, and the balance water is described.

8 Claims, 7 Drawing Figures

PROCESS AND APPARATUS FOR ETCHING COPPER BASE MATERIALS

This application is a division, of application Ser. No. 715,317, filed Mar. 25, 1985, and a Continuation-In-Part of U.S. patent application Ser. No. 539,598, filed Oct. 6, 1983.

This invention relates to a process and apparatus for etching copper and copper base alloys using an aqueous peroxydisulfuric acid solution.

The fundamental cleaning medium or etchant used in the copper industry is sulfuric acid at a strength of about 10 to 15% by volume. The extensive use of sulfuric acid is based on the fact that for most brasses and high copper alloys, the annealing oxides are readily soluble in mineral acids. This produces very rapid oxide removal and the resulting cleaning process is, therefore, readily amenable to a short immersion time, continuous operation.

However, an increasing number of copper alloys now contain elements which form insoluble, refractory-type oxides. For these alloys, alternative cleaning or etching procedures have been developed. These alternative procedures generally involve adding an oxidant such as sodium dichromate or hydrogen peroxide to the cleaning solution. While sodium dichromate has been used effectively for years, its use has been discontinued because of its known high toxicity and restrictions on waste treatment and discharge level. While hydrogen peroxide does not suffer from these disadvantages, it is limited by its inherent stability problems. Hydrogen peroxide will decompose to water plus oxygen during storage. In addition and more importantly, the decomposition of peroxide is greatly accelerated by elevated temperatures and/or the presence of dissolved copper in the cleaning solution. These factors limit the maximum etching rates that can be obtained with solutions containing hydrogen peroxide.

In response to these shortcomings and the need for an effective oxidizing cleaning solution, attention has turned to persulfate solutions. The use of persulfate is attractive for copper cleaning because the end products of its reaction with copper are sulfuric acid and copper sulfate. As such, no special waste water treatment is required. Furthermore, a depleted or spent persulfate solution may be regenerated and the copper in the depleted solution may be reclaimed. Typically, persulfate cleaning solutions comprise an aqueous solution containing a persulfate salt such as ammonium persulfate or sodium persulfate. Persulfate salts are used because they are readily available and more stable than other forms of persulfate such as peroxydisulfuric acid. U.S. Pat. Nos. 2,978,301 to Margulies et al., 3,475,242 to Radimer, 3,671,344 to Chiang et al., 3,887,405 to Fong et al. and 4,144,144 to Radimer et al. illustrate the use of aqueous persulfate salt solutions to etch copper materials.

The use of electrochemical cells to regenerate spent solutions and to reclaim metal values from the spent solutions is also well known in the art. Typically, these cells have at least one anode chamber and at least one cathode chamber physically separated by a membrane. Depending upon the type of solution being regenerated and the chemical reactions sought to be produced, the membrane may comprise either an ion exchange member or a microporous separator. Depending upon the process, the spent solution may be used as either the anolyte or the catholyte in the cell. U.S Pat. Nos. 2,748,071 to Eisler, 2,865,823 to Harris et al., 3,761,369 to Tirrell, 3,764,503 to Lancy et al., 4,051,001 to Inoue et al., and 4,149,946 to Burke illustrate some of the electrochemical cells for regenerating spent solutions.

It is known in the prior art to regenerate persulfate etchants using electrochemical cells. In one such regeneration technique, the spent persulfate etchant is first treated to remove a mixture containing ammonium persulfate and the corresponding metal sulfate. This mixture is then transferred to the cathode chamber of the electrochemical cell where it is used as the catholyte. The remainder of the spent solution is transferred to the anode chamber of the cell where it is used as the anolyte. The cathode and anode chambers of the cell are separated by a diaphragm which permits at least hydrogen ions to pass freely between the anolyte and the catholyte while preventing any substantial amount of persulfate in the anolyte from mixing with the catholyte. By passing an electric current between the anolyte and catholyte, metal is plated out at the cathode and persulfate values are produced at the anode. U.S. Pat. No. 3,406,108 to Radimer et al. illustrates this technique for regenerating spent persulfate etchants. The primary deficiency of this technique is its complexity which renders it commercially unacceptable.

A second and simpler technique is illustrated in U.S. Pat. No. 3,470,044 to Radimer. In this technique, the spent aqueous ammonium persulfate etching solution is used as the anolyte in an electrochemical cell. An electrolyte such as an acidic bisulfate or a bisulfate containing electrolyte is used as the catholyte of the cell. The cathode and anode sections of the cell are separated by a cationic exchange membrane which permits the dissolved metal ions to pass from the anolyte into the catholyte but which prevents any substantial amount of persulfate in the anolyte from mixing with the catholyte. By passing an electric current through the catholyte and the anolyte, dissolved metal is removed from the solution at the cathode and sulfate values are converted to persulfate values at the anode.

While simpler, this second technique is believed to be inefficient and commercially unacceptable. The production of temperature sensitive, oxidizing cleaning solutions such as persulfate etchants often require electrolyte temperatures to be maintained within certain critical limits during processing. Therefore, an electrochemical cell for regenerating such a temperature sensitive solution should have some means for controlling electrolyte temperature. Furthermore, special anodes are often required to improve cell efficiency. Such temperature control means and special anodes are known in the art. U.S.S.R. Patent Nos. 311,502 and 470,307 both to Markov et al. illustrate some special anode constructions.

It is an object of the present invention to provide a process for etching copper and copper base materials with an aqueous peroxydisulfuric acid solution.

It is a further object of the present invention to provide a process and apparatus for electrolytically generating the peroxydisulfuric acid etching solution.

These and further objects will become apparent from the following description and drawings in which like elements have been given like reference numbers.

In accordance with the present invention, a relatively simple but yet highly efficient process for etching copper and copper base materials is provided. The process comprises preparing off-line an etching solution consisting essentially of peroxydisulfuric acid in an effective amount up to about 6N. and up to about 500 ppm of a halide addition, introducing the etching solution into a cleaning tank and immersing the copper or copper base material in the etching solution. Within the cleaning tank, the peroxydisulfuric acid concentration of the etching solution is maintained in a range from about 0.2 N. to about 5.5N., preferably from about 0.5 N. to about 2 N. If needed, the concentrated etching solution may be diluted with water when introduced into the cleaning tank to obtain the desired working concentration of peroxydisulfuric acid. During cleaning, a desired peroxydisulfuric acid concentration may be maintained by bleeding concentrated peroxydisulfuric acid into the solution in the cleaning tank.

As the amount of copper dissolved in the cleaning solution increases and/or the amount of peroxydisulfuric acid becomes significantly depleted, the etching rate or cleaning power of the solution decreases. When the cleaning power or etching rate of the solution reaches a level where it is no longer feasible to clean the copper or copper base material within commerical time constraints, the solution is withdrawn from the tank and replaced by a fresh cleaning solution. The withdrawn spent cleaning solution may be either discarded or recirculated to an electrolytic cell for regeneration.

The apparatus described herein in connection with the accompanying drawings provides a means for practicing the process of the present invention.

The present invention is concerned with effectively cleaning or etching copper base materials including copper and copper alloys. The copper base materials to be cleaned may have any form. For example, the materials may be in strip form, tube form, rod form, wire form or shaped into an article. Furthermore, the cleaning may be carried out either batchwise or continuously.

Figure 1:
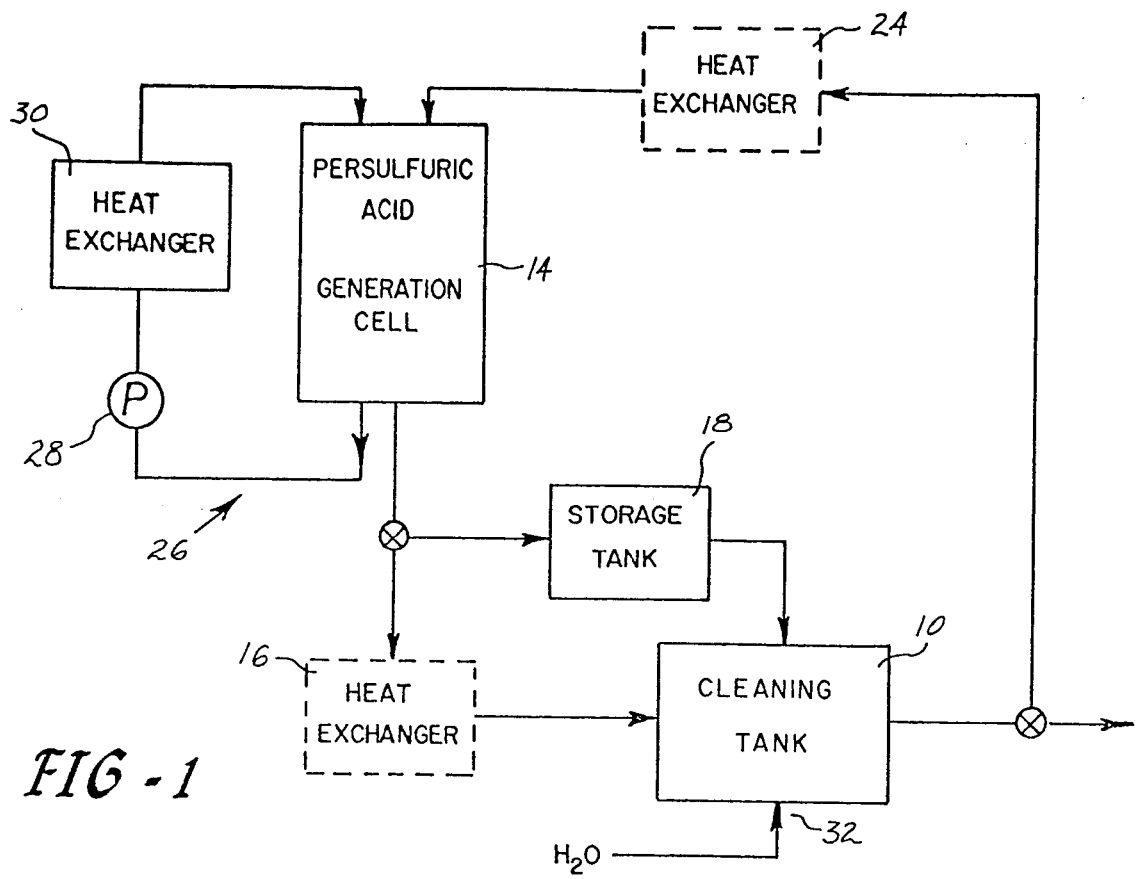
FIG. 1 is a schematic representation of a system for cleaning metal strip in accordance with the present invention.

Referring now to FIG. 1, a system for cleaning a copper base material is illustrated. The copper base material not shown to be cleaned is passed through a cleaning tank 10 containing an etching solution in accordance with the present invention. The copper base material may be passed through the tank 10 in any suitable manner known in the art. If necessary, the material may be subjected to a mechanical cleaning action such as abrasion or another pretreatment, e.g. being passed through a boiling caustic solution, prior to entering the tank 10. The type of pretreatment used, if any, will of course depend upon the material being cleaned and the nature of the contaminants being removed.

In accordance with the present invention, the etching solution in the tank 10 comprises an aqueous peroxydisulfuric acid solution consisting essentially of peroxydisulfuric acid in a working concentration of from about 0.2N. to about 5.5N., preferably from about 0.5N. to about 2N. For reasons to be explained more fully hereinafter, up to about 500 ppm of a halide addition may also be present in the solution. Peroxydisulfuric acid in the above concentrations has been found to be an effective cleaning agent. While similar cleaning effectiveness has been obtained using persulfate salt cleaning solutions such as aqueous sodium persulfate or ammonium persulfate solutions, it is preferred in accordance with this invention to use a peroxyacid solution rather than a persulfate salt solution for the following reasons. The presence of additional ions such as $Na^+$ or $NH_4^+$ ions in a persulfate salt solution can lead to the production of undesirable products, e.g. ammonia. Furthermore, they complicate any regeneration process because the additional ions, i.e. $Na^+$ or $NH_4^+$, as well as the useful persulfate ions have to be replenished.

The etching solutions of the present invention are also characterized by the absence of chromium or chromate ions, significant amounts of other mineral acids, organic materials such as diazines and purines, and intentional metal ion additions. The absence of chromium, chromate ions and organic materials is important from both environmental and economic standpoints. These materials can be toxic and expensive waste treatment facilities are generally needed to treat them prior to disposal. The absence of intentional metal ion additions and significant amounts of other mineral acids is important in that additional values do not have to be generated initially and/or replenished during any regeneration process.

Since peroxydisulfuric acid tends to decompose more rapidly at elevated temperatures, it has been found to be particularly advantageous to carry out the present etching process while the solution is at a temperature in the range of about 15° C. to about 50° C., preferably from about 20° C. to about 35° C. If needed, the tank 10 may be provided with a suitable cooling system not shown for removing heat and maintaining the cleaning solution within the desired temperature ranges.

To further retard the decomposition rate of the peroxydisulfuric acid in the etching solution, the cleaning system may be provided with suitable means such as heat exchanger 16 for providing cooled etching solution to the cleaning tank 10. It is believed to be desirable to provide the etching solution to the tank 10 at a temperature in the range of about 0° C. to about 15° C., preferably from about 0° C. to about 10° C.

An aqueous peroxydisulfuric acid solution tends to decompose sequentially as follows:

$$H_2S_2O_8 + H_2O \rightarrow H_2SO_5 + H_2SO_4 \tag{1}$$

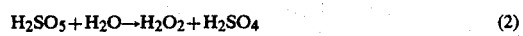
$$H_2SO_5 + H_2O \rightarrow H_2O_2 + H_2SO_4 \tag{2}$$

$$2H_2O_2 \rightarrow 2H_2O + O_2 \tag{3}$$

It has been surprisingly found that as the peroxydisulfuric acid $H_2S_2O_8$ decomposes to a combination of peroxydisulfuric acid $H_2S_2O_8$ + peroxymonosulfuric acid $H_2SO_5$ that the etching rate of the solution tends to increase. Thereafter, the etching rate remains substantially constant until $H_2S_2O_8$ changes almost completely.

As the copper or copper base material passes through the solution, copper ions will dissolve into the solution and the following reactions typically take place:

$$H_2S_2O_8 + Cu \rightarrow Cu^{2+} + H_2SO_4 + SO_4^{=} \qquad (4)$$

$$H_2SO_5 + Cu \rightarrow CuSO_4 + H_2O \qquad (5)$$

$$H_2O_2 + H_2SO_4 + Cu \rightarrow CuSO_4 + 2H_2O \qquad (6)$$

As a result, the depleted etching solution tends to contain some $H_2S_2O_8$, $H_2SO_5$, $H_2O_2$, $H_2SO_4$ and $Cu^{2+}$.

If too much copper is present in the depleted solution, $CuSO_4$ crystals could form. To prevent this from happening, it is desirable to withdraw the depleted solution before any significant copper ion level is reached. To this end, the tank 10 may be provided with means not shown for monitoring the bath condition. The monitoring means may comprise any suitable detection means known in the art to monitor any desired parameter such as bath temperature and/or copper concentration.

The cleaning tank 10 may also be provided with means not shown for agitating the etching solution to insure that fresh cleaning species contact the copper or copper base material at all times. The agitating means may comprise any suitable stirring device known in the art such as one or more impellers not shown driven by a power source not shown.

Figure 2:
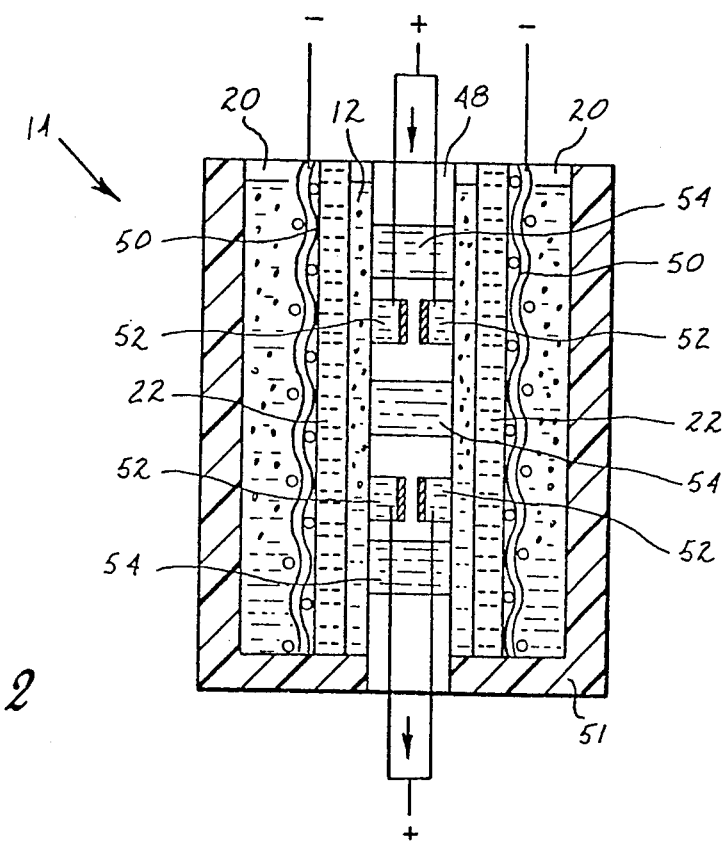
FIG. 2 is a partial cross-sectional view of an electrochemical cell for generating/regenerating a peroxydisulfuric acid etching solution.

Because of peroxydisulfuric acid's thermal instability problems, it is desirable to produce the etching solution of the present invention on site. Consequently, the cleaning system includes an electrochemical cell 14 for generating a desired concentrated peroxydisulfuric acid solution. Referring now to FIG. 2, a generation cell is illustrated. The cell 14 comprises a central anode chamber 12 containing an anode 48 and a pair of cathode chambers 20, each containing a cathode 50. A physical separator 22 separates the anode chamber 12 from each cathode chamber 20. The physical separators 22 are primarily used to prevent mixing of the products in the anode and cathode chambers and may be mounted in the cell 14 in any suitable manner. The physical separators 22 may either be a diaphragm such as a microporous polyethylene diaphragm or an ion exchange membrane such as a cation exchange membrane, e.g. a Nafion membrane. A diaphragm would be used where it is desired to have a restricted bulk flow from one chamber to another without any preference to the charge of the ions passing therethrough. An ion exchange membrane would be used where it is desired to substantially prevent any bulk flow while permitting only the flow of certain perferred ions across the membrane.

In the cell embodiment of FIG. 2, the anode 48 may comprise at least one hollow tube or conduit through which for reasons to be explained hereinafter a heat exchange medium flows, at least one current collector 52 bonded to the outer surface of each tube and at least one electrochemically active portion 54 also bonded to the outer surface of each tube. In a preferred construction, the anode 48 comprises a grid-like structure formed by a plurality of spaced-apart substantially parallel tubes, a plurality of spaced-apart substantially parallel current collectors 52 arranged substantially transverse to the tubes, and a plurality of electrochemically active portions 54 located on each tube substantially adjacent to and between the location where each current collector 52 is bonded to each tube.

If desired, the anode 48 may comprise at least one solid rod having a desired cross sectional shape in lieu of the hollow tube(s). Where such a construction is used, one or more current collectors and one or more electrochemically active portions may be bonded to the outer surface of the solid rod(s). The electrochemically active portions 54 may cover all or only selected portions of the rod(s). Alternatively, the anode 48 may comprise any desired combination of solid rod and hollow tube constructions.

Each tube or solid rod is formed from an electrically conductive material. While any suitable electrically conductive material inert to the electrolyte may be used, it has been found to be desirable to form each tube or solid rod from titanium, tantalum, niobium or alloys thereof.

The current collectors 52 preferably each comprise a pair of spaced-apart strips of electrically conductive material. Each strip may be contoured to form good electrical contact with each tube or solid rod. The strips may be bonded to the tubes or solid rods in any suitable manner known in the art, e.g. spot welding. To promote a substantially uniform current distribution throughout the cell, the current collectors 52 are substantially uniformly distributed over the length of each tube or solid rod. The number, the spacing and the size of the current collectors 52 depend upon the range of current densities used in the cell and the operating electrode surface area. While any suitable metal or metal alloy having good electrical conductivity properties may be used to form the current collectors 52, titanium, tantalum, niobium or alloys thereof are preferred materials. If desired, each current collector 52 may be formed from a composite material having a core formed from a high conductivity material such as aluminum, copper and alloys thereof and a clad surface formed from a metal selected from the group of titanium, tantalum, niobium and alloys thereof.

The electrochemically active portions 54 are preferably formed by metal members bonded to the tubes or solid rods. For example, a plurality of metal rings can be spot welded to or inlayed in the tubes or solid rods. The extent of the portions 54 and their surface area depend upon the range of current densities used during cell operation. If needed, the portions 54 could cover the total electrically conductive area exposed to the anolyte. While the portions 54 may be formed from any suitable metal or metal alloy, it is preferred to form them from platinum or one of its alloys because platinum forms oxides which slow down oxygen evolution at the anode and provides a desired overvoltage. Bright recrystallized platinum is a particularly useful material from which the portions 54 may be formed.

The cathode 50 in each cathode chamber 20 may be formed from a metallic mesh type structure such as a copper or copper alloy screen. It is desirable that the mesh structure have at least about 50% of its surface area open to promote good mass transport from the surrounding catholyte and better usage of the physical separators 22. Preferably, each cathode has about 50% to about 70% of its surface area open.

The anode 48 and the cathodes 50 may be electrically connected to any conventional power supply not shown known in the art. Preferably, the anode 48 is connected to the current source or power supply via one or more copper busses not shown attached to the current collectors 52. This type of cell construction and its operation is further described in U.S. Pat. No. 4,482,440 to Kadija, which is hereby incorporated by reference.

To generate peroxydisulfuric acid using the cell 14, an aqueous sulfuric acid solution is introduced into the anode and cathode chambers as the anolyte and the catholyte. The aqueous sulfuric acid solution may be supplied to the cathode and anode chambers by a circulation loop 26. The circulation loop 26 may have a pump 28 for providing the desired circulation. Preferably, the catholyte flows through the cathode chambers 20 in the same direction that the anolyte flows through the anode chamber 12. Circulation of the sulfuric acid solution is desirable from an efficiency standpoint.

It has been found that to generate the desired concentration of peroxydisulfuric acid for the etching solution, the sulfuric acid solution should contain from about 5% to about 50% by volume sulfuric acid, preferably from about 20% to about 25% by volume sulfuric acid. It has been found that such concentrations assist in reducing the activity of water and, therefore, the evolution of oxygen at the anode.

Since the persulfate ion is relatively unstable in solution and its concentration tends to decay rapidly in time, it is desirable to maintain the catholyte and anolyte within a temperature range of about 0° C. to about 20° C. during the regeneration process. Preferably, the catholyte and anolyte are maintained at a temperature in the range of about 0° C. to about 10° C. Control of heat build-up in the anolyte also helps to favor the production of persulfate values as opposed to the production of peroxide values.

To maintain the temperature of the anolyte and the catholyte within the desired limits, a heat exchange medium is circulated through the anode chamber 12. The heat exchange medium may comprise any suitable heat exchange fluid known in the art such as a refrigerated aqueous glycol solution. The heat exchange fluid may be circulated through the chamber 12 by a heat exchange loop not shown. The heat exchange loop may comprise a pump not shown for circulating the heat exchange fluid, a unit not shown for cooling and/or heating the heat exchange fluid, and the hollow tube or tubes forming part of the anode 48. The heat exchange fluid preferably flows through the heat exchange loop in a manner that enables the fluid in each tube to travel in a direction counter to the anolyte and catholyte flow direction.

Alternatively, the anolyte and catholyte may be maintained within the desired temperature range by including in the circulation loop 26, a means 30 for cooling and/or heating the sulfuric acid solution before it enters the anode and cathode chambers. The heating/cooling means 30 may comprise any suitable heat exchanger known in the art. If this alternative approach is used, the hollow tube anode construction may be replaced by the aforementioned solid rod anode construction and the heat exchange loop may be omitted.

It also has been found that the rate of decomposition of the persulfate values may be decreased by making a halide addition to the anolyte. The halide addition also tends to increase overall cell efficiency. Generally, about 10 ppm to about 500 ppm of a suitable halide such as a chloride or a fluoride is added to the anolyte. If a chloride is being added, the addition should preferably be in the range of about 100 ppm to about 200 ppm. If a fluoride is being added, the addition should preferably be in the range of about 50 ppm to about 100 ppm. While the addition may be made using any form of the halide, it is preferred to make an acid addition such as hydrochloric acid or hydrofluoric acid.

In operation, a voltage sufficient to cause a current density in the active area of the anode in the range of about 0.4 A/cm$^2$ to about 1.0 A/cm$^2$, preferably from about 0.6 A/cm$^2$ to about 0.8 A/cm$^2$, is applied to the cell. A voltage in the range of about 4 to about 6 volts is generally sufficient to produce the desired current densities. Upon application of the voltage, sulfate ions are oxidized to persulfate ions at the anode. There also tends to be some production of hydrogen gas at the cathode and oxygen gas at the anode; however, the production of these gases does not hamper the generation process. In fact, they create a bubble lifting effect that promotes both anolyte and catholyte movement.

To provide the cleaning tank 10 with an etching solution having the desired peroxydisulfuric acid working concentration, it may be necessary to prepare in the cell 14 a concentrated solution having a peroxydisulfuric acid concentration as high as about 6N. While the minimum amount of peroxydisulfuric acid in the concentrated solution may be as low as that needed to effectively etch copper or a copper base alloy, the preferred concentration is in the range of about 2N. to about 5N. Most preferably, the peroxydisulfuric acid concentration is in the range of about 3.5N. to about 5N. When producing solutions have the higher peroxydisulfuric acid concentrations, it is desirable to keep the anolyte and catholyte temperatures as low as possible within the aforesaid temperature ranges.

After the concentrated etching solution has been prepared, it may be delivered to either the cleaning tank 10 or a storage tank 18. The cleaning system preferably includes suitable ducting and valve(s) for delivering the etching solution to either tank 10 or 18. As previously discussed, the etching solution may be passed through a heat exchanger 16 prior to being delivered to the tank 10. If the etching solution 10 is to be stored in tank 18, the tank 18 may be provided with suitable means such as a cooling loop not shown for maintaining the solution temperature within the range of about 0° C. to about 15° C., preferably from about 0° C. to about 10° C.

Prior to etching, the concentrated aqueous peroxydisulfuric acid solution may have to be diluted to obtain a desired working peroxydisulfuric acid concentration. To this end, tank 10 may be provided with a water inlet 32. During etching, it may be necessary to bleed concentrated peroxydisulfuric acid into cleaning tank 10 to maintain the desired working concentration of peroxydisulfuric acid. The concentrated peroxydisulfuric acid bleed solution may come from either the storage tank 18 or the cell 14. If desired, concentrated aqueous peroxydisulfuric acid solution may be continually fed into the tank 10 from either tank 18 or cell 14.

After the cleaning power of the solution has been depleted so that etching cannot be carried out within a commercially acceptable time, the spent peroxydisulfuric acid solution may be withdrawn from the tank 10 and either discarded or sent back to cell 14 to be regenerated. As previously discussed, one of the advantages of the present invention is that no special waste treatments have to be performed on the etching solution prior to it being discarded. The withdrawn solution may be replaced by fresh solution from either cell 14 or storage tank 18.

If the withdrawn solution is to be regenerated, it is circulated back to the cell 14 where it is introduced into the cell as the anolyte in lieu of the sulfuric acid anolyte. Regeneration may be carried out under the same conditions of temperature, current density, voltage, concentration of sulfuric acid in the catholyte, and halide addition as previously outlined with regard to solution generation. The only significant difference between solution generation and solution regeneration is that the withdrawn solution contains copper values which have to be removed during the regeneration proces. Copper removal may be effected by plating the copper values onto the cathode(s) and providing means for removing the copper from the cathode(s). If the solution is being regenerated in a batchwise manner, the entire cathode structure may be removed and replaced. If the solution is being continuously regenerated, the cathode(s) may be formed from an endless metallic mesh belt not shown rotated by a suitable drive motor not shown. A metal removing device not shown such as a conventional scraping knife or blade may be used to remove the plated metal from the belt.

If desired, the withdrawn solution may be passed through a suitable cooling device such as heat exchanger 24 prior to being introduced into the cell 14. In this way, the spent solution may be provided to the cell at a desired temperature. If adjustments in raw material concentration are needed prior to solution regeneration, the withdrawn solution may be first transferred from the cleaning tank 10 to a reconditioning unit not shown. The reconditioning unit may comprise any suitable solution reconditioning means known in the art. Of course, the type of reconditioning unit utilized will depend upon the type of adjustment that needs to be made to the spent solution. For example, the reconditioning unit may comprise means for adding one or more raw materials to the solution.

The following examples are presented to demonstrate the present invention.

EXAMPLE I

To compare cleaning power or etching rate, the following cleaning solutions were prepared: (1) an aqueous peroxydisulfuric acid solution (PDA) containing 1.85M peroxydisulfuric acid and 200 ppm $Cl^-$ maintained at 25° C; (2) a 12% $H_2SO_4$-3% $H_2O_2$-distilled water solution maintained at 43° C; (3) a 12% $H_2SO_4$-3% $H_2O_2$-LATAP water solution maintained at 43° C; (4) an aqueous 2N. ferric sulfate solution maintained at 80° C.; and (5) an aqueous 2N. ferric sulfate solution containing 0.3M $Cu^{2+}$ maintained at 80° C. The chloride addition to the peroxydisulfuric acid solution was made using HCl. 1"×2" coupons of copper alloy C11000 were prepared and weighed. Several coupons were then immersed in each solution for 15 seconds. After being removed, the coupons were rinsed in water and reweighed. The procedure was then repeated again with each coupon being reweighed a second time. The etching rate of each solution is reported in Table I.

TABLE I

| Solution | Etching Rate (mg/cm²/sec) |
|---|---|
| 1.85 M peroxydisulfuric acid w/200 ppm $Cl^-$ | .081 |
| 12% $H_2SO_4$—3% $H_2O_2$-distilled $H_2O$ | .070 |
| 12% $H_2SO_4$—3% $H_2O_2$-tap $H_2O$ | .011 |
| 2N.ferric sulfate | .120 |
| 2N.ferric sulfate + 0.3 M $Cu^{2+}$ | .095 |

EXAMPLE II

Figure 3:
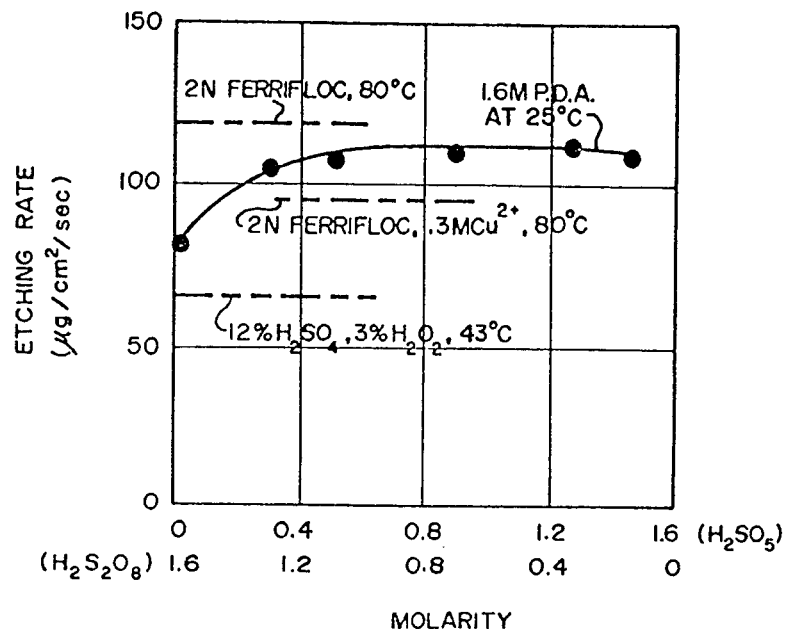
FIG. 3 is a graph illustrating the etching rate of peroxydisulfuric acid as a function of its composition.

A 1.6M peroxydisulfuric acid solution $H_2S_2O_8$ was prepared and permitted to decompose at room temperature (22° C.) to peroxymonosulfuric acid $H_2SO_5$. At various intervals, the solution was tested to measure its composition, in particular, the concentration of peroxydisulfuric acid and peroxymonosulfuric acid. During these intervals, coupons of alloy C11000 were immersed in the solution as in Example I. Prior to the first immersion and after each immersion, the coupons were weighed so that the solution's etching rate could be determined. As can be seen from FIG. 3, the etching rate increased as the $H_2S_2O_8$ decomposed into $H_2SO_5$ until a point after the solution had a concentration of about 1.2M $H_2SO_5$ and about 0.4M $H_2S_2O_8$. Thereafter, the etching rate was slightly decreased. FIG. 3 also illustrates the etching rate of the 1.6M peroxydisulfuric acid as it decomposes compared to the etching rate of other cleaning solutions.

EXAMPLE III

1"×2" coupons of copper alloys C68800 and C65400 were prepared. The C68800 coupons were prepared from C68800 strip that had been bell annealed. The C65400 coupons were prepared from C65400 strip material that had been strip annealed.

The C68800 samples were first immersed in a boiling caustic solution containing 1N. NaOH. The solution was at about 100° C. Different coupon samples were immersed for different time intervals. The time intervals were 10 seconds, 20 seconds and 30 seconds. After being rinsed, some of the samples were immersed in an aqueous 12% $H_2SO_4$-3% $H_2O_2$ solution which was at about 43° C. The remainder of the coupons were immersed in an aqueous peroxydisulfuric acid solution containing 1.8M peroxydisulfuric acid and about 200 pmm $Cl^-$ which was at about 25° C. The chloride addition to the peroxydisulfuric acid solution was made using HCl. The immersion time of the respective samples in each cleaning solution reflected its immersion time in the boiling caustic solution. For example, if the sample had been immersed in the caustic solution for 10 seconds, it was immersed in the acid cleaning solution for 10 seconds.

The C65400 samples were divided into two groups. The first group was immersed in an aqueous 12% $H_2SO_4$-3% $H_2O_2$ solution at about 43° C. for the following time intervals: 20 seconds; 30 seconds; and 40 seconds. The second group was immersed in an aqueous peroxydisulfuric acid solution containing 1.8M peroxydisulfuric acid and about 100 ppm $F^-$ at about 25° C. The fluoride addition was made as HF. The C65400 samples were immersed in the peroxydisulfuric acid solution for the following time intervals: 15 seconds; 25 seconds; and 35 seconds. None of the C65400 samples were subjected to a caustic solution pretreatment.

All of the samples were rinsed in water and dried after immersion in the acid cleaning solution. The samples were then evaluated by dip soldering in a 60% Sn-40% Pb solder bath at about 238° C. A resin flux was applied prior to the dip tests. All samples were immersed in the bath for five seconds and then slowly pulled out. The solderability of the dipped samples was subjectively rated using the following system:

| Class | Description |
|---|---|
| 1 | Uniform smooth coating |
| 2 | Uniform rough coating |
| 2a | <5% dewetting |
| 3 | <50% dewetting <10% pinholes |
| 4 | >50% dewetting >10% pinholes |

-continued

| Class | Description |
|-------|-------------|
| 5 | No adhesion |

As can be seen from Table II, the samples of C68800 and C65400 cleaned with the peroxydisulfuric acid solution exhibited better solderability ratings—the lower the class, the better the rating. With respect to the C65400 samples, those cleaned in the peroxydisulfuric acid solution exhibited better solderability rating with shorter immersion times.

TABLE II

| Alloy | Treatment | Immersion Time (sec) | Solderability Rating |
|-------|-----------|----------------------|---------------------|
| C68800 | NaOH/$H_2SO_4$—$H_2O_2$ | 10 | 4 |
| C68800 | NaOH/$H_2SO_4$—$H_2O_2$ | 20 | 3–4 |
| C68800 | NaOH/$H_2SO_4$—$H_2O_2$ | 30 | 3–4 |
| C68800 | NaOH/$H_2S_2O_8$ w/200 ppm $Cl^-$ | 10 | 2 |
| C68800 | NaOH/$H_2S_2O_8$ w/200 ppm $Cl^-$ | 20 | 2 |
| C68800 | NaOH/$H_2S_2O_8$ w/200 ppm $Cl^-$ | 30 | 2 |
| C65400 | $H_2SO_4$—$H_2O_2$ | 20 | 4–5 |
| C65400 | $H_2SO_4$—$H_2O_2$ | 30 | 3–4 |
| C65400 | $H_2SO_4$—$H_2O_2$ | 40 | 2a |
| C65400 | $H_2S_2O_8$ w/100 ppm $F^-$ | 15 | 3 |
| C65400 | $H_2S_2O_8$ w/100 ppm $F^-$ | 25 | 2 |
| C65400 | $H_2S_2O_8$ w/100 ppm $F^-$ | 35 | 2 |

EXAMPLE IV

To demonstrate the effect of temperature on the stability of peroxydisulfuric acid solutions, solutions initially containing 1.5M $H_2S_2O_8$ and about 2.5M $H_2S_2O_8$ were prepared. None of these solutions contained a halide addition. A portion of the 2.5M $H_2S_2O_8$ solution was kept at 0° C. and allowed to decompose for several days. The 1.5M $H_2G_2O_8$ solution were kept at room temperature (about 22° C.) and allowed to decompose for several days.

Figure 4:
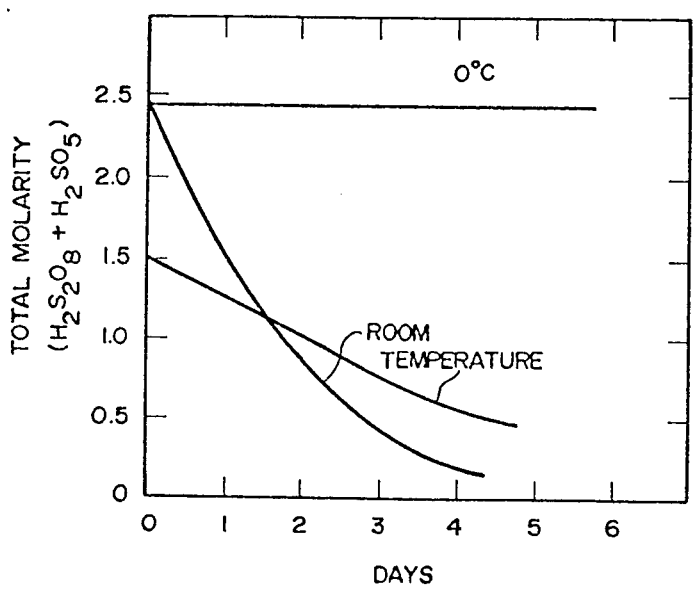
FIG. 4 is a graph illustrating the stability of peroxydisulfuric acid as a function of time and temperature.

As can be seen from FIG. 4, the solution at 0° C. retained a substantially constant total molarity. As used herein, the total molarity is the sum of the peroxydisulfuric acid molarity and the peroxymonosulfuric acid molarity. In comparison, the total molarity of the solutions at room temperature deteriorated rather rapidly.

EXAMPLE V

To illustrate the effect of a halide addition on decreasing the decomposition rate of peroxydisulfuric acid, an aqueous 1.6M $H_2S_2O_8$ solution was prepared. 100 ppm of $F^-$ was added to the solution using hydrofluoric acid. The solution with the halide addition was kept at room temperature and permitted to decompose.

Figure 5:
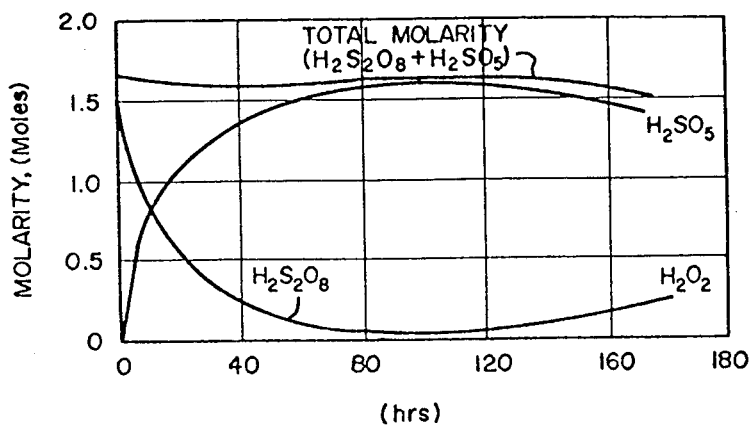
FIG. 5 is a graph illustrating the stability of peroxydisulfuric acid with a halide addition as a function of time.

As can be seen from FIG. 5, the amount of $H_2S_2O_8$ in the solution decreased rather rapidly while the amount of $H_2SO_5$ in the solution increased. As a result, the total molarity, the sum of $H_2S_2O_8$ and $H_2SO_5$ in solution, remained substantially constant. It can be seen from FIG. 5 that when the concentration of $H_2SO_5$ starts to decrease, the concentration of $H_2O_2$ increases. This clearly demonstrates the decomposition mechanism of peroxyacids discussed hereinbefore.

By comparing the total molarity curve of FIG. 5 with the total molarity curve of the 1.5M solution in FIG. 4, it can be seen that the addition of a halide to the peroxydisulfuric acid solution decreases its rate of decomposition as represented by total molarity.

EXAMPLE VI

To illustrate the effect of a halide ion addition on the generation of peroxydisulfuric acid in an electrochemical cell such as the one shown in FIG. 2, several aqueous 20 v/o $H_2SO_4$ solutions were prepared. The following additions were made to various samples of the $H_2SO_4$ solution: (a) 100 ppm $Cl^-$; (b) 200 ppm $Cl^-$; and (c) 100 ppm $F^-$. The chloride additions were made as hydrochloric acid and the fluoride addition was made as hydrofluoric acid.

The solutions with the halide additions were used as the anolyte in the cell. For comparison purposes, an aqueous 20 v/o $H_2SO_4$ solution without any halide addition was also used as an anolyte in the cell. For all tests, the catholyte was an aqueous 20 v/o $H_2SO_4$ solution. The anode and cathode chambers of the cell were separated by a Nafion membrane and an aqueous glycol solution at about 0° C. was circulated through the anode chamber during each test. During the peroxydisulfuric acid generation process, the anolyte was maintained at a temperature in the range of 5° C. to 8° C. A current density of 0.4 A/cm² at a voltage of 5.5 V was applied to the cell.

As can be seen from Table III, the halide addition to the anolyte tended to improve cell efficiency. As used herein, cell efficiency may be defined as the amount of charge theoretically needed to convert 100% of the sulfuric acid to $H_2SO_8$ divided by the actual charge used to generate the peroxydisulfuric acid.

TABLE III

| Halide Addition (ppm) | Peroxydisulfuric Acid (molarity) | Cell Efficiency (%) |
|-----------------------|----------------------------------|---------------------|
| None | 1.6 | 11 |
| 100 $Cl^-$ | 1.6 | 22 |
| 200 $Cl^-$ | 1.8 | 37 |
| 100 $F^-$ | 1.8 | 40 |

EXAMPLE VII

To demonstrate the effect of temperature on cell efficiency and $H_2S_2O_8$ generation, an aqueous 20 v/o $H_2SO_4$ solution containing 100 ppm F was prepared as in Example VI and introduced into the cell of FIG. 2 as the anolyte. As before, an aqueous 20 v/o $H_2SO_4$ solution without any halide was used as the catholyte, Nafion membrane separated the anode and cathode chambers, and an aqueous glycol solution was circulated through the anode chamber. A current density of 0.6 A/cm² was applied across the cell.

Figure 6:
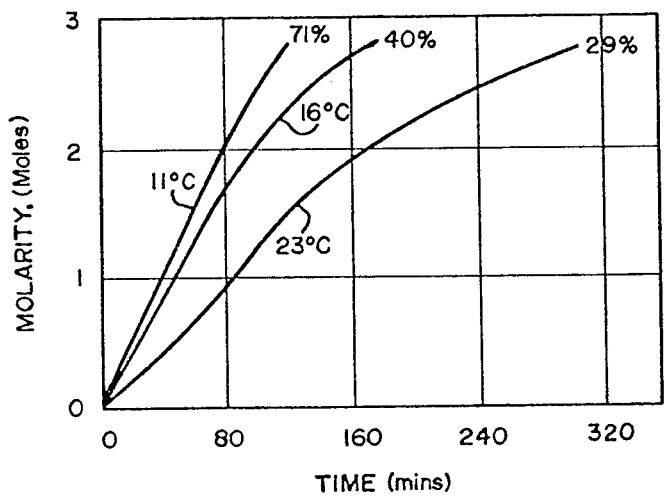
FIG. 6 is a graph illustrating the effect of temperature on cell efficiency and peroxydisulfuric acid generation.

As can be seen from FIG. 6, cell efficiency decreased as anolyte temperature increased. Furthermore, the rate of peroxydisulfuric acid production tended to be higher for the lower temperatures.

EXAMPLE VIII

Figure 7:
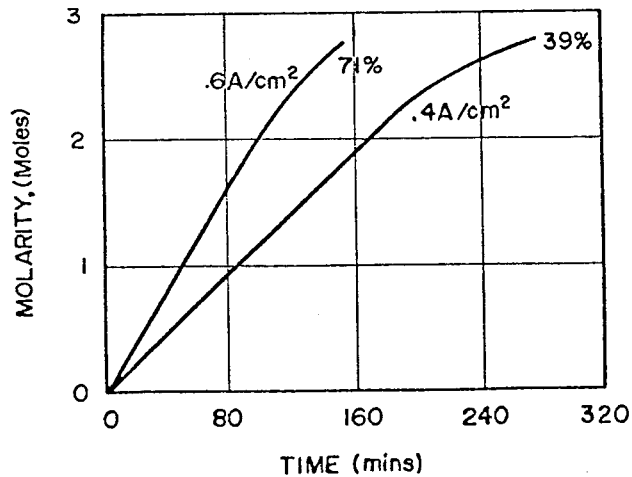
FIG. 7 is a graph illustrating the effect of current density on the generation of peroxydisulfuric acid using a cell similar to that shown in FIG. 2.

To demonstrate the effect of currenty density on cell efficiency and peroxydisulfuric acid generation, an aqueous sulfuric acid solution containing 100 ppm $F^-$ was prepared as in Example VI and introduced into the cell of FIG. 2 as the anolyte. The other cell conditions were the same as in Example VII except that the anolyte temperature was maintained at 11° C. and a current density of 0.4 A/cm² was applied during one test and a current density of 0.6 A/cm² was applied during a second test. It can be seen from FIG. 7 that the higher the current density, the better the cell efficiency and the rate of production of peroxydisulfuric acid.

While a particular type of electrochemical cell has been illustrated to generate/regenerate the peroxydisulfuric acid cleaning solution, other types of electrochemical cells could be utilized.

While any suitable heat exchange fluid at any desired temperature may be circulated through the anode chamber to control the temperature of the anolyte as shown in FIG. 2, it is preferred to use an aqueous glycol solution at a temperature of about −5° C. to about 5° C., most preferably at about 0° C., as the heat exchange fluid.

While the examples illustrate the use of peroxydisulfuric acid solutions to clean copper alloys C11000, C65400 and C68800, the solution may be used to clean copper and other copper alloys. Depending upon the type of copper or copper base alloy forming the material to be cleaned and the nature of the contaminants on the material, it may be desirable to pretreat the material prior to its immersion in the peroxydisulfuric acid solution. Any suitable pretreatment such as immersion in a boiling caustic solution or mechanical action may be used.

While it is desirable to maintain the catholyte and anolyte temperatures within the generation/regeneration cell within the aforesaid temperature ranges, it is possible to generate/regenerate peroxydisulfuric acid with the anolyte and catholyte solution temperature near the freezing point of the anolyte/catholyte solution.

The patents and the U.S. patent application set forth in the specification are intended to be incorporated by reference herein.

It is apparent that there has been provided in accordance with this invention a process and apparatus for etching copper base materials which fully satisfy the objects, means, and advantages set forth hereinbefore. While the invention has been described in combination with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

What is claimed:

1. A solution for etching copper or copper base materials consisting essentially of peroxydisulfuric acid in an effective amount for etching copper or copper based materials up to about 6.0N, a halide addition in an effective amount for decreasing the rate of decomposition of the persulfate values, up to about 500 ppm, and the balance water.

2. The solution of claim 1 further comprising said peroxydisulfuric acid being present in an amount of from about 0.2N to about 5.5N.

3. The solution of claim 1 further comprising said peroxydisulfuric acid being present in an amount of from about 0.5N to about 2.0N.

4. The solution of claim 1 further consisting essentially of a halide selected from the group consisting of a chloride and a fluoride.

5. A solution for etching copper or copper based materials consisting essentially of peroxydisulfuric acid in an effective amount for etching copper or copper based materials, up to about 6.0N, a halide addition in an amount from about 10 ppm to about 500 ppm, and the balance water.

6. The solution of claim 5 further comprising said peroxydisulfuric acid being present in an amount of from about 0.2N to about 5.5N.

7. The solution of claim 5 further comprising said peroxydisulfuric acid being present in an amount from about 0.5N to about 2.0N.

8. The solution of claim 5 further consisting essentially of a halide selected from the group consisting of a chloride and a fluoride.

* * * * *